United States Patent
Kosaka

(10) Patent No.: US 11,644,742 B2
(45) Date of Patent: May 9, 2023

(54) PHASE SHIFT MASK BLANK, MANUFACTURING METHOD THEREOF, AND PHASE SHIFT MASK

(71) Applicant: Shin-Etsu Chemical Co., Ltd., Tokyo (JP)

(72) Inventor: Takuro Kosaka, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 17/723,080

(22) Filed: Apr. 18, 2022

(65) Prior Publication Data

US 2022/0236638 A1 Jul. 28, 2022

Related U.S. Application Data

(63) Continuation of application No. 16/832,744, filed on Mar. 27, 2020, now Pat. No. 11,333,965.

(30) Foreign Application Priority Data

Mar. 29, 2019 (JP) .............................. JP2019-067113
Jun. 14, 2019 (JP) .............................. JP2019-111054

(51) Int. Cl.
*G03F 1/26* (2012.01)
*G03F 1/32* (2012.01)

(52) U.S. Cl.
CPC . *G03F 1/26* (2013.01); *G03F 1/32* (2013.01)

(58) Field of Classification Search
CPC ..................................... G03F 1/26; G03F 1/32
USPC ............................................................ 430/5
See application file for complete search history.

(56) References Cited

U.S. PATENT DOCUMENTS

| | | |
|---|---|---|
| 5,474,864 A | 12/1995 | Isao et al. |
| 5,547,787 A | 8/1996 | Ito et al. |
| 5,629,114 A | 5/1997 | Isao et al. |
| 5,691,090 A | 11/1997 | Isao et al. |
| 7,767,366 B2 | 8/2010 | Yoshikawa et al. |
| 8,003,284 B2 | 8/2011 | Yoshikawa et al. |
| 8,012,654 B2 | 9/2011 | Yoshikawa et al. |
| 2016/0291456 A1 | 10/2016 | Kosaka et al. |
| 2018/0335691 A1 | 11/2018 | Nam et al. |
| 2019/0064650 A1 | 2/2019 | Kosaka et al. |

FOREIGN PATENT DOCUMENTS

| | | |
|---|---|---|
| JP | 7-140635 A | 6/1995 |
| JP | 2002-40625 A | 2/2002 |
| JP | 2007-33469 A | 2/2007 |
| JP | 2007-233179 A | 9/2007 |
| JP | 2007-241065 A | 9/2007 |

OTHER PUBLICATIONS

Extended European Search Report dated Sep. 7, 2020 for Application No. 20163726.1.
Ito et al., "Optimization of optical properties for single-layer halftone mask", SPIE vol. 2197, Mar. 1994, 12 pages, XP-000989174.
Ito et al., "Passivate SiNx halftone phase shifting mask for deep ultraviolet exposure", J. Vac. Sci. Technol. B, vol. 14, No. 6, Nov./Dec. 1996, pp. 4199-4202, XP-000721148.
Smith et al., "Development and Characterization of nitride and oxide based composite materials for sub 0.18 μm attenuated phase shift masking", Microelectronic Engineering, vol. 35, 1997, pp. 201-204.

*Primary Examiner* — Christopher G Young
(74) *Attorney, Agent, or Firm* — Birch, Stewart, Kolasch & Birch, LLP

(57) ABSTRACT

Provided is a phase shift mask blank including a substrate, and a phase shift film thereon, the phase shift film composed of a material containing silicon and nitrogen and free of a transition metal, exposure light being KrF excimer laser, the phase shift film consisting of a single layer or a plurality of layers, the single layer or each of the plurality of layers having a refractive index n of at least 2.5 and an extinction coefficient k of 0.4 to 1, with respect to the exposure light, and the phase shift film having a phase shift of 170 to 190° and a transmittance of 4 to 8%, with respect to the exposure light, and a thickness of up to 85 nm.

20 Claims, 5 Drawing Sheets

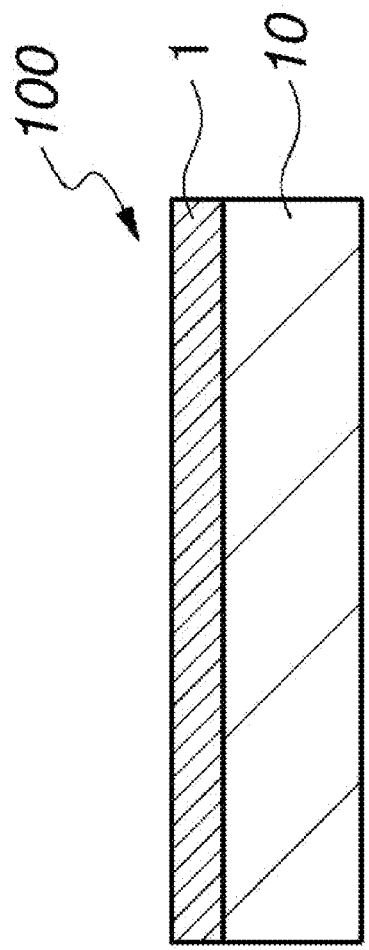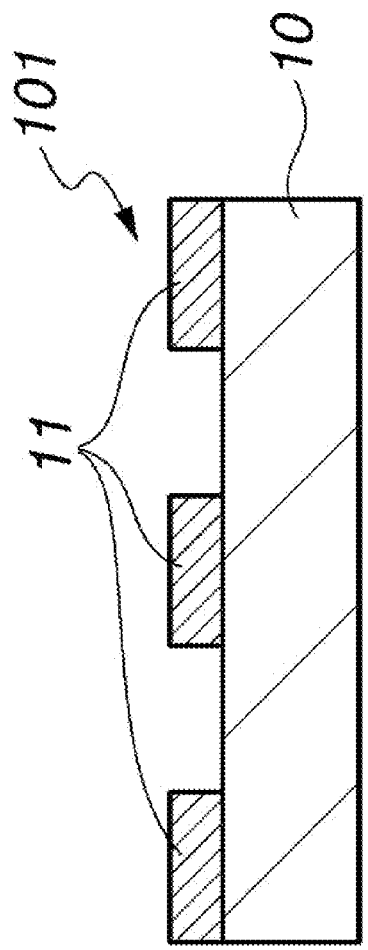
FIG.1A
FIG.1B

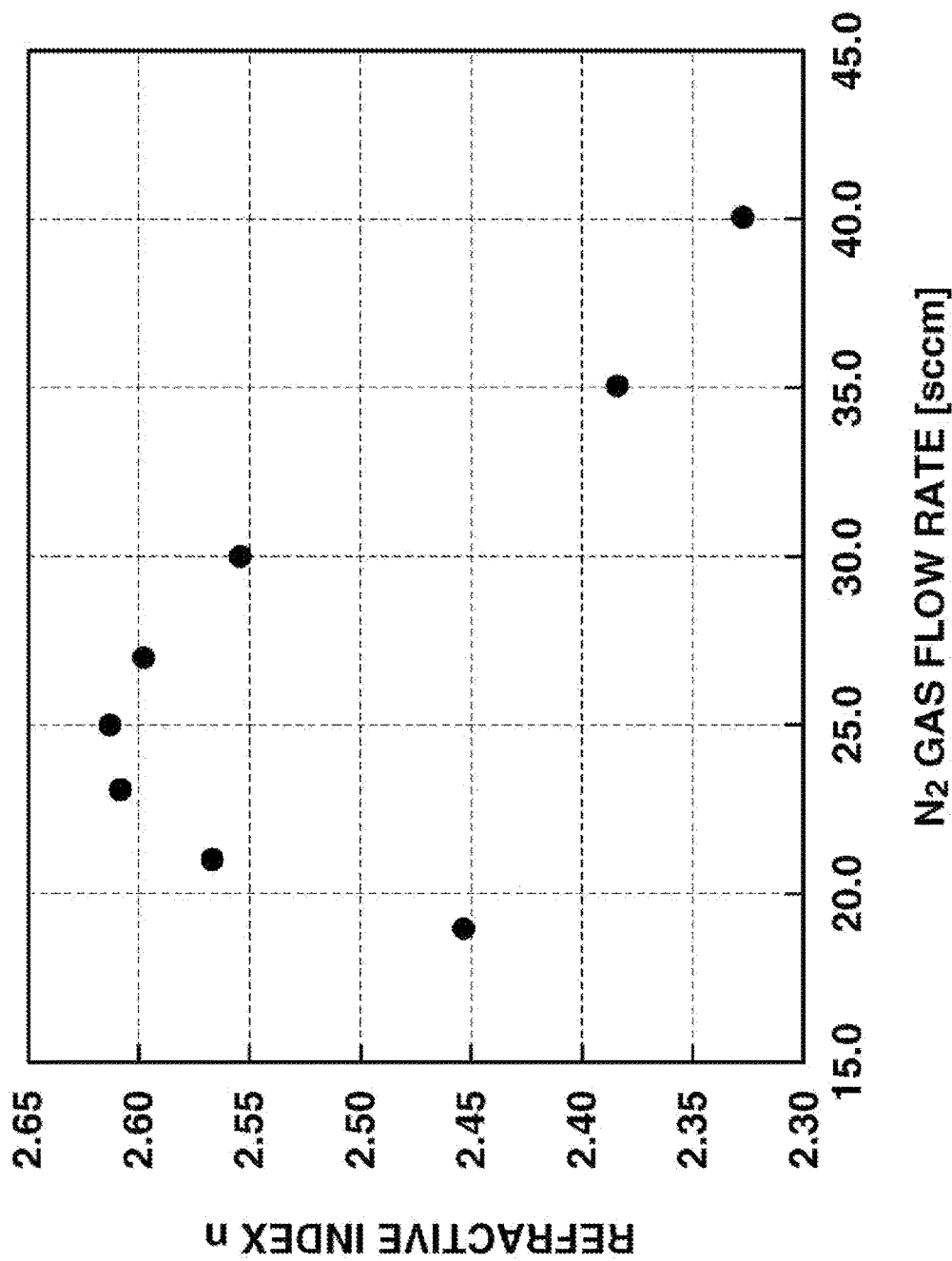

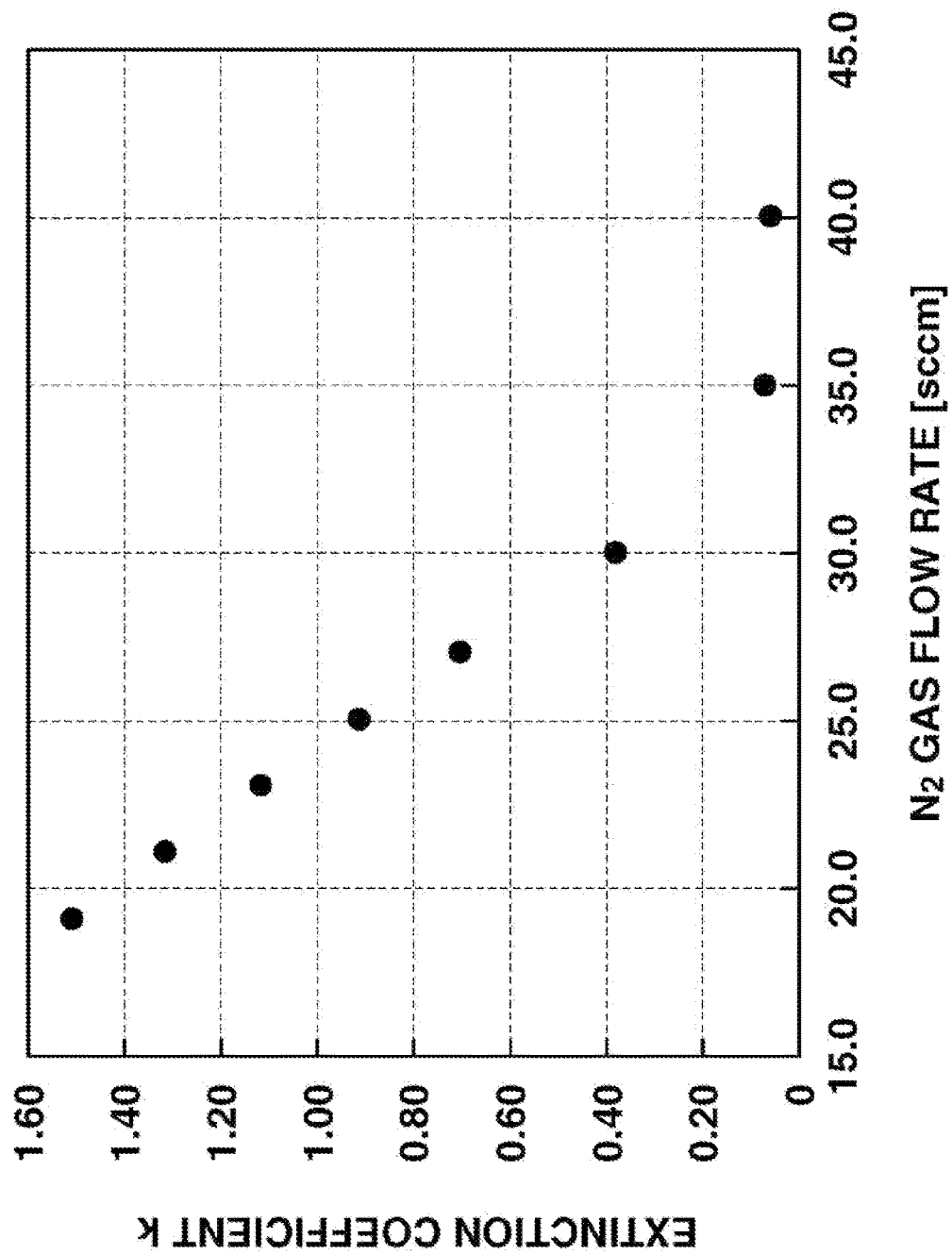

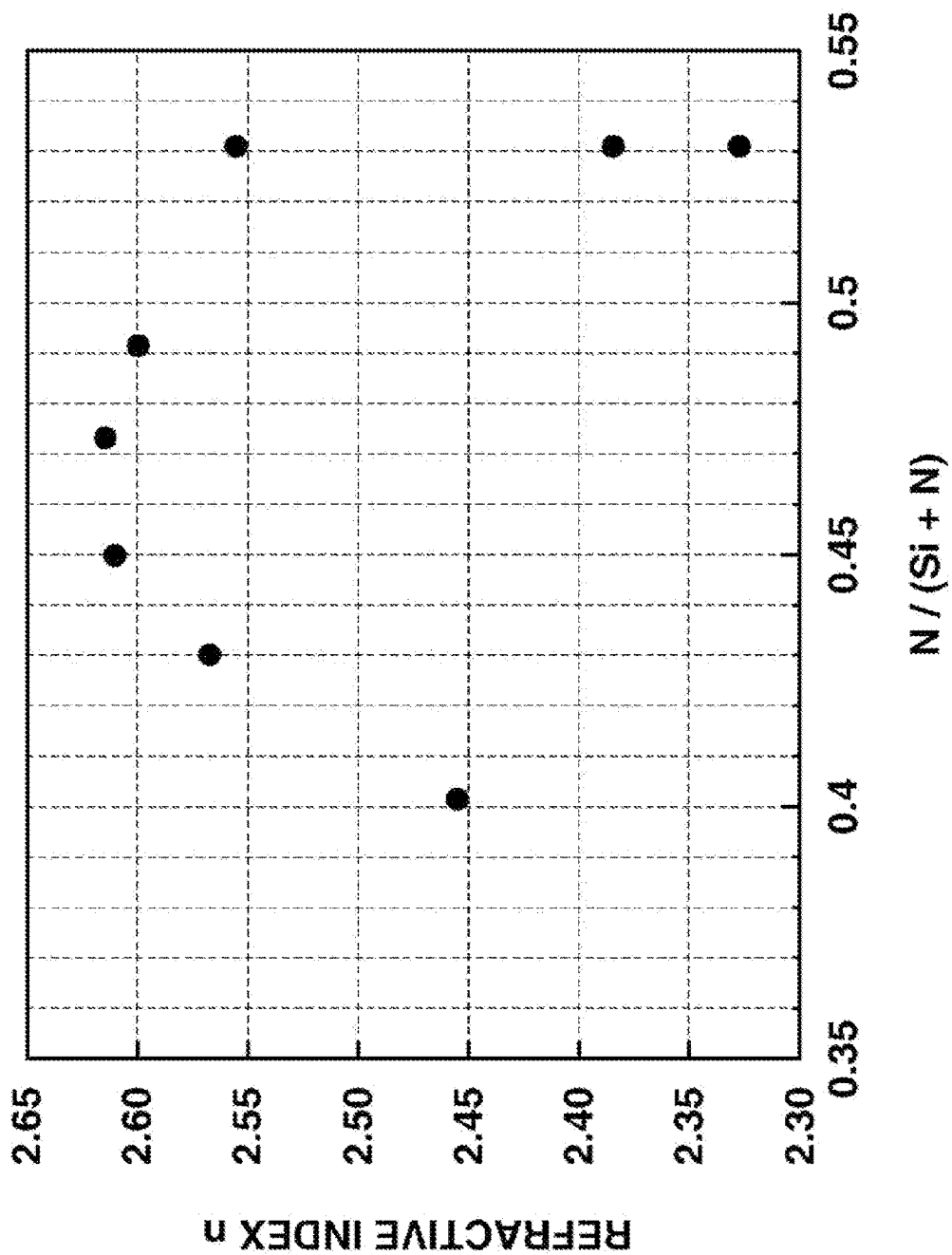

PHASE SHIFT MASK BLANK, MANUFACTURING METHOD THEREOF, AND PHASE SHIFT MASK

CROSS-REFERENCE TO RELATED APPLICATION

This application is a Continuation application of co-pending application Ser. No. 16/832,744, filed on Mar. 27, 2020, which claims the benefit under 35 U.S.C. § 119(a) to Patent Application No. 2019-067113, filed in Japan on Mar. 29, 2019 and Patent Application No. 2019-111054, filed in Japan on Jun. 14, 2019, all of which are hereby expressly incorporated by reference into the present application.

TECHNICAL FIELD

The invention relates to a phase shift mask blank and a phase shift mask, typically used for manufacturing a semiconductor integrated circuit, and a manufacturing method of a phase shift mask blank.

BACKGROUND ART

In a photolithography technique used in a semiconductor technology, a phase shift method is used as one of a resolution enhancement technology. The phase shift method is, for example, a method using a photomask in which a phase shift film is formed on a substrate, and is a contrast enhancing method by forming a phase shift film pattern disposed on a transparent substrate being a photomask substrate which is transparent to exposure light, and utilizing interference of lights. The phase shift film pattern has a phase shift of approximately 180° that is a difference between a phase through the phase shift film and a phase through a portion that is not formed the phase shift film, in other word, a phase through air having a length same as the thickness of the phase shift film. A halftone phase shift mask is one of the photomasks employing such method. The halftone phase shift mask includes a transparent substrate made of quartz or the like which is transparent to exposure light, and a mask pattern of a halftone phase shift film which is formed on the transparent substrate and has a phase shift of approximately 180° to a phase through a portion not formed the phase shift film, and a transmittance substantively insufficient to contribute to exposure. Until now, as a phase shift film for a phase shift mask, a film containing molybdenum and silicon is mostly used (JP-A H07-140635 (Patent Document 1)).

CITATION LIST

Patent Document 1: JP-A H07-140635
Patent Document 2: JP-A 2007-33469
Patent Document 3: JP-A 2007-233179
Patent Document 4: JP-A-2007-241065

DISCLOSURE OF INVENTION

In case that exposure light is KrF excimer laser (wavelength of 248 nm), a phase shift film having a transmittance of 6%, a phase shift of approx. 180° and a thickness of approx. 100 nm is generally used in a phase shift mask employed a film containing molybdenum and silicon. Recently, for a phase shift film used with ArF excimer laser (wavelength of 193 nm) as exposure light, a phase shift film of silicon nitride has been used for the purposes of minimizing film thickness and enhancing washing resistance and light resistance. Although not much as exposure light of ArF excimer laser, also when KrF excimer laser is used as the exposure light, the phase shift film having high washing resistance and high light resistance and being hard to generate haze is needed.

When KrF excimer laser is used as exposure light with silicon nitride, it is necessary to adjust the content ratio of nitrogen and silicon in accordance with its wavelength for forming a film satisfying a predetermined phase shift and a predetermined transmittance with KrF excimer laser. Further, in consideration of inclination of the pattern during processing into the phase shift mask, and a cross-sectional shape of the pattern, a thinner film having a uniform composition is desired. When exposure light is ArF excimer laser, silicon nitride containing more nitrogen has a higher refractive index n and a smaller extinction coefficient k. Thus, a phase shift film having a nitrogen content as high as possible has been proposed.

The present invention has been made to solve the above problems, and an object of the present invention is to provide a phase shift mask blank and a phase shift mask, including a thin phase shift film, and satisfying a requirement for pattern miniaturization, which is advantageous in terms of patterning and reduction of three-dimensional effect, and with satisfying necessary phase shift and transmittance for the phase shift film even when exposure light is KrF excimer laser having a wavelength of 246 nm. Further, another object of the present invention is to provide a manufacturing method of the phase shift mask blank.

The inventor has found that: when the exposure light is KrF excimer laser, unlike the ArF excimer laser, silicon nitride has a highest refractive index n at a content (at %) ratio Si/N of about 53/47; and a thin film cannot be achieved by simply increasing of nitrogen content. Further, the inventor has found that regarding silicon nitride for exposure light of KrF excimer laser, in a phase shift mask blank for exposure with KrF excimer laser having a wavelength of 248 nm, a phase shift film having a composition containing silicon and nitrogen and free of a transition metal, and satisfying a predetermined refractive index n and a predetermined extinction coefficient k or having a nitrogen ratio in a predetermined range can provide a phase shift amount (phase shift) of 170 to 190°, and particularly, a transmittance of 4 to 8%, with respect to the exposure light, with a thickness of up to 85 nm, thereby a phase shift mask blank and a phase shift mask including a thinner phase shift film are obtained.

In one aspect, the invention provides a phase shift mask blank including a substrate, and a phase shift film thereon, the phase shift film composed of a material containing silicon and nitrogen and free of a transition metal, wherein
exposure light is KrF excimer laser,
the phase shift film consists of a single layer or a plurality of layers, the single layer or each of the plurality of layers has a refractive index n of at least 2.5 and an extinction coefficient k of 0.4 to 1, with respect to the exposure light, and
the phase shift film has a phase shift of 170 to 190° and a transmittance of 4 to 8%, with respect to the exposure light, and a thickness of up to 85 nm.

Preferably, the single layer or each of the plurality of layers has a content ratio $N/(Si+N)$ within a range of 0.43 to 0.53, the ratio $N/(Si+N)$ representing nitrogen content (at %) to the sum of silicon and nitrogen contents (at %).

In other aspect, the invention provides a phase shift mask blank including a substrate, and a phase shift film thereon, the phase shift film composed of a material containing silicon and nitrogen and free of a transition metal, wherein
exposure light is KrF excimer laser,
the phase shift film consists of a single layer or a plurality of layers, at least part of the single layer or at least part of the plurality of layers has a content ratio N/(Si+N) within a range of 0.43 to 0.53, the ratio N/(Si+N) representing nitrogen content (at %) to the sum of silicon and nitrogen contents (at %), and
the phase shift film has a phase shift of 170 to 190° with respect to the exposure light.

In other aspect, the invention provides a method of manufacturing the phase shift mask blank of any one of claims 1 to 3, including the step of:
forming the phase shift film by reactive sputtering using a silicon-containing target and nitrogen gas, wherein
in the forming step, a flow rate of the nitrogen gas is set to a value of −20% to +20% of the flow rate imparting the highest refractive index n, with respect to the exposure light, of the phase shift film, and maintained constant or varied continuously or stepwise, the flow rate imparting the highest refractive index n being obtained from varying the flow rate from low rate to high rate.

Preferably, in the forming step, the flow rate of the nitrogen gas is set to the flow rate imparting the highest refractive index n, with respect to the exposure light, of the phase shift film, and maintained constant.

Preferably, the sputtering is a magnetron sputtering, and the silicon-containing target is silicon target.

In other aspect, the invention provides a phase shift mask manufactured by using the phase shift mask blank.

Advantageous Effects of the Invention

According to the invention, there is provided a phase mask blank and a phase shift mask having a thinner phase shift film which is advantageous in terms of patterning and exposure, with satisfying necessary phase shift and transmittance for the phase shift film used in exposure light of KrF excimer laser.

BRIEF DESCRIPTION OF THE DRAWINGS

FIGS. 1A and 1B are cross-sectional views illustrating an exemplary phase shift mask blank and a phase shift mask of the invention.
FIG. 3 is a graph plotting refractive indexes n with respect to flow rates of nitrogen gas in Example 1.
FIG. 4 is a graph plotting extinction coefficients k with respect to flow rates of nitrogen gas in Example 1.
FIG. 5 is a graph plotting refractive indexes n with respect to content ratios N/(Si+N) in Example 1.

DESCRIPTION OF THE PREFERRED EMBODIMENTS

Figure 2A:
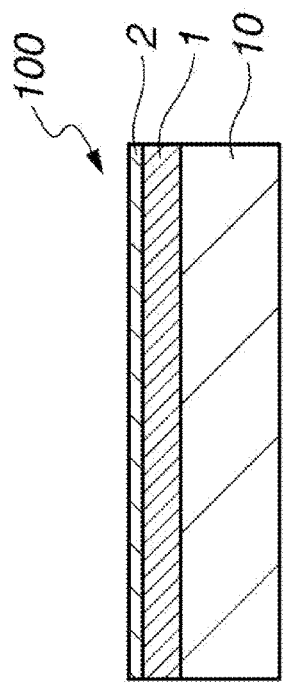
FIGS. 2A to 2C are cross-section views illustrating other examples of a phase shift mask blank of the invention.

The phase shift mask blank of the invention includes a transparent substrate such as a quartz substrate, and a phase shift film that is provided on the transparent substrate. The phase shift mask of the invention includes a transparent substrate such as a quartz substrate, and a mask pattern (photomask pattern) of a phase shift film which is provided on the transparent substrate.

The transparent substrate in the invention is preferably, for example, a 6 inch square, 0.25 inch thick transparent substrate, called 6025 substrate specified by the SEMI standard, which is often denoted by a 152 mm square, 6.35 mm thick transparent substrate, according to the SI unit system.

FIG. 1A is a cross-sectional view illustrating an exemplary phase shift mask blank of the invention. In this embodiment, a phase shift mask blank 100 includes a transparent substrate 10, and a phase shift film 1 formed on the transparent substrate 10. FIG. 1B is a cross-sectional view illustrating an exemplary phase shift mask of the invention. In this embodiment, the phase shift mask 101 includes the transparent substrate 10, and a phase shift film pattern 11 formed on the transparent substrate 10. A phase shift mask can be obtained by using a phase shift mask blank and forming a pattern of its phase shift film.

The phase shift film in the invention, with a prescribed thickness, has a predetermined phase shift amount (phase shift) and a predetermined transmittance, with respect to exposure light of KrF excimer laser (wavelength: 248 nm). The phase shift film of the invention is composed of a material containing silicon and nitrogen and free of a transition metal. To improve washing resistance of the film, it is effective to add oxygen to the phase shift film. Thus, the material containing silicon and nitrogen and free of a transition metal may contain oxygen in addition to silicon and nitrogen. However, the refractive index n of the film is reduced when oxygen is added, so, the film thickness tends to be increased. Therefore, as the material containing silicon and nitrogen and free of a transition metal, a material consisting essentially of silicon and nitrogen (a material consisting of two of the elements and inevitable impurities) is preferable.

The phase shift film may consist of a single layer or a plurality of layers which is to designed so as to satisfy necessary phase shift and transmittance for the phase shift film. In each case of the single layer and the plurality of layers, the single layer or each of the plurality of layers may be a single composition layer in which the composition does not vary in a thickness direction, or a compositionally graded layer in which the composition varies in a thickness direction.

In the single layer or each of the plurality of layers of the inventive phase shift film, a refractive index n is preferably at least 2.5, more preferably at least 2.55. The upper limit of the refractive index n is normally up to 2.7. In the single layer or each of the plurality of layers of the inventive phase shift film, a extinction coefficient k is preferably at least 0.4, more preferably at least 0.5, and preferably up to 1, more preferably up to 0.8.

In the phase shift film of the invention, a content ratio N/(Si+N) is preferably at least 0.43, more preferably 0.45, and preferably up to 0.53, more preferably up to 0.5 in at least part of the single layer, particularly in the whole of the single layer when the phase shift film is constructed by a single layer, or in at least part of the plurality of layers, particularly in each of the plurality of layers (in all layers) when the phase shift film is constructed by a plurality of layers. The ratio N/(Si+N) represents nitrogen content (at %) to the sum of silicon and nitrogen contents (at %). Notably, the compositionally graded layer is employed, it is preferable that graded range of the composition is within the above content ratio range. In case that the single layer or each of the plurality of layers contains oxygen, an oxygen content is preferably up to 30 at %, more preferably up to 10 at %, most preferably up to 5 at %.

The phase shift of the exposure light which passes through the phase shift film in the invention may be enough to be able to increase contrast at the boundary between an area having the phase shift film (phase shift area) and an area without the phase shift film, as a result of phase shift due to interference of exposure lights passing through the respective areas. The phase shift may be at least 170° and up to 190°. Meanwhile, a transmittance of the phase shift film in the invention may be at least 4% and up to 8% with respect to exposure light. The phase shift film in the invention may have the phase shift and the transmittance with respect to KrF excimer laser (wavelength: 248 nm), controlled within the aforementioned range.

When a whole thickness of the phase shift film is thin, fine patterns can be readily formed. Thus, the whole thickness of the phase shift film in the invention may be up to 85 nm, preferably up to 80 nm. Meanwhile, the lower limit of the thickness of the phase shift film may be set so long as the desired optical characteristics may be obtained with exposure light, and is typically at least 50 nm, however not limited thereto.

The phase shift film in the invention may be formed by known methods for forming film. The phase shift film is preferably formed by sputtering by which highly homogenous film is easily obtainable, and the sputtering may be either DC sputtering or RF sputtering, and preferably magnetron sputtering. Target and sputtering gas are properly selected depending on kind and composition of the layer to be formed. Examples of the target include a silicon-containing target such as silicon target, silicon nitride target, and a target containing both of silicon and silicon nitride. The nitrogen content may be controlled by reactive sputtering using nitrogen gas for a reactive gas as a sputtering gas under properly controlling an amount of feeding. Rare gases such as helium gas, neon gas and argon gas are also employable as the sputtering gas.

When the phase shift film of the invention is formed by reactive sputtering using a silicon-containing target and nitrogen gas, the phase shift film is formed preferably at a flow rate of the nitrogen gas that is set to a value of −20% to +20% of the flow rate imparting the highest refractive index n, with respect to the exposure light, particularly at a flow rate of the nitrogen gas that is set to a value of the flow rate imparting the highest refractive index n, with respect to the exposure light. A phase shift film having a phase shift of 170 to 190° and a transmittance of 4 to 8% can be formed thinner by this way. The flow rate imparting the highest refractive index n may be determined beforehand by confirming a variation of refractive index n of silicon nitride while the flow rate is varied from low rate to high rate. At this time, sputtering conditions (power applied to the target, flow rate of other sputter gase, sputter pressure, etc.) other than the flow rate of the nitrogen gas are fixed (constant). Notably, when the film is actually formed, the flow rate may be maintained constant or varied continuously or stepwise.

The phase shift film consisting multiple layers may include an oxidized surface layer formed as the outermost layer on the top face (on the side remote from the transparent substrate), for the purpose of suppressing change of properties of the phase shift film. The oxidized surface layer may have an oxygen content of at least 20 at %, preferably at least 50 at %. Examples of methods for forming the oxidized surface layer specifically include atmospheric oxidation (natural oxidation); and forced oxidation treatment such as treatment of a sputtered film with ozone gas or ozonated water, or heating at least 300° C. in an oxygen-containing atmosphere such as oxygen gas atmosphere, by heating in oven, lamp annealing or laser heating. The oxidized surface layer preferably has a thickness of up to 10 nm, more preferably up to 5 nm, most preferably up to 3 nm. An effect of the oxidized surface layer is obtainable typically with a thickness of at least 1 nm. While the oxidized surface layer may be formed by sputtering under an increased oxygen amount, the oxidized surface layer is more preferably formed by the aforementioned atmospheric oxidation or oxidation treatment in terms of obtaining the layer with fewer defects.

The phase shift mask blank of the invention may include a second layer consisting of a single layer or multiple layers, and is formed over the phase shift film. The second layer is usually provided adjacent to the phase shift film. The second layer is specifically exemplified by a light shielding film, a combination of a light shielding film and an antireflection film, and a process-aid film that functions as a hard mask in the process of patterning the phase shift film. In case where a third layer is employed as described below, the second layer may be used as a process-aid film that functions as an etching stopper (etching stopper film) in the process of patterning the third layer. Material of the second layer is preferably a chromium-containing material.

This embodiment is specifically exemplified by a phase shift mask blank illustrated in FIG. 2A. FIG. 2A is a cross-sectional view illustrating an exemplary phase shift mask blank of the invention. In this embodiment, a phase shift mask blank 100 includes a transparent substrate 10, a phase shift film 1 formed on the transparent substrate 10, and a second layer 2 formed on the phase shift film 1.

The phase shift mask blank of the invention may include a light shielding film or an etching mask film which functions as a hard mask when a pattern is formed to a phase shift film, as the second layer, provided over the phase shift film. Alternatively, a light shielding film and an antireflection film may be combined to form the second layer. The second layer including a light shielding film can provide an area that is fully block the exposure light in a phase shift mask. The light shielding film and the antireflection film may also be used as a process-aid film in the etching. There are many reports regarding film structure and materials for the light shielding film and antireflection film (JP-A 2007-33469 (Patent Document 2), JP-A 2007-233179 (Patent Document 3), for example). Preferred film structure having the light shielding film and the antireflection film combined therein is exemplified by a structure in which a light shielding film composed of a chromium-containing material is provided, and an antireflection film composed of a chromium-containing material for reducing reflection from the light shielding film is further provided. The light shielding film and the antireflection film may consist of a single layer or multiple layers. Examples of the chromium-containing material of the light shielding film and the antireflection film include chromium (simple substance), and a chromium compound such as chromium oxide (CrO), chromium nitride (CrN), chromium carbide (CrC), chromium oxynitride (CrON), chromium oxycarbide (CrOC), chromium nitride carbide (CrNC) and chromium oxynitride carbide (CrONC). Notably, the chemical formulae that represent the chromium-containing materials merely denote constituent elements, rather than compositional ratios of the constituent elements (the same shall apply to the chromium-containing materials hereinafter).

For the second layer as the light shielding film, or the combination of a light shielding film and an antireflection film, the chromium compound in the light shielding film has a chromium content of preferably at least 40 at %, more preferably at least 60 at %, and preferably less than 100 at %, more preferably up to 99 at %, most preferably up to 90 at %. The oxygen content is preferably up to 60 at %, more preferably up to 40 at %, and preferably at least 1 at %. The nitrogen content is preferably up to 50 at %, more preferably up to 40 at %, and preferably at least 1 at %. The carbon content is preferably up to 20 at %, more preferably up to 10 at %, and if the etching rate is necessarily adjusted, preferably at least 1 at %. In this case, a total content of chromium, oxygen, nitrogen and carbon is preferably at least 95 at %, more preferably at least 99 at %, and most preferably 100 at %.

For the second layer as the combination of a light shielding film and an antireflection film, the antireflection film is preferably composed of a chromium compound, and the chromium compound has a chromium content of preferably at least 30 at %, more preferably at least 35 at %, and up to 70 at %, more preferably up to 50 at %. The oxygen content is preferably up to 60 at %, and preferably at least 1 at %, more preferably at least 20 at %. The nitrogen content is preferably up to 50 at %, more preferably up to 30 at %, and preferably at least 1 at %, more preferably at least 3 at %. The carbon content is preferably up to 20 at %, more preferably up to 5 at %, and if the etching rate is necessarily adjusted, preferably at least 1 at %. In this case, a total content of chromium, oxygen, nitrogen and carbon is preferably at least 95 at %, more preferably at least 99 at %, most preferably 100 at %.

For the second layer as the light shielding film, or the combination of a light shielding film and an antireflection film, the second layer has a thickness of usually 20 to 100 nm, and preferably 40 to 70 nm. A total optical density of the phase shift film and the second layer are preferably at least 2.0, more preferably at least 2.5, most preferably at least 3.0, with respect to exposure light.

Over the second layer of the phase shift mask blank of the invention, a third layer consisting of a single layer or multiple layers may be provided. The third layer is usually provided adjacent to the second layer. The third layer is specifically exemplified by a process-aid film that functions as a hard mask in the process of patterning the second layer, a light shielding film, and a combination of a light shielding film and an antireflection film. A material composing the third layer is preferably a silicon-containing material, particularly a silicon-containing material free of chromium.

Figure 2B:
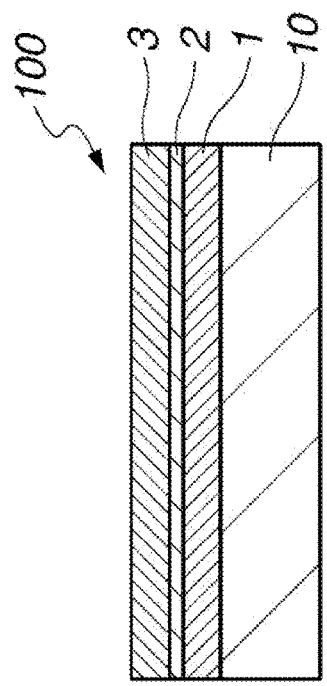

This embodiment is specifically exemplified by a phase shift mask blank illustrated in FIG. 2B. FIG. 2B is a cross-sectional view illustrating an exemplary phase shift mask blank of the invention. In this embodiment, the phase shift mask blank 100 includes a transparent substrate 10, a phase shift film 1 formed on the transparent substrate 10, a second layer 2 formed on the phase shift film 1, and a third layer 3 formed on the second layer 2.

For the second layer as the light shielding film, or the combination of a light shielding film and an antireflection film, a process-aid film (etching mask film) which functions as a hard mask in the process of patterning the second layer may be provided as the third layer. In case where a fourth layer is employed as described below, the third layer may be used as a process-aid film that functions as an etching stopper (etching stopper film) in the process of patterning the fourth layer. The process-aid film is preferably composed of a material that differs in etching characteristics from the second layer, such as a material resistant to chlorine-based dry etching for a chromium-containing material, in particular, a silicon-containing material which can be etched by fluorine-containing gases such as $SF_6$ and $CF_4$. Examples of the silicon-containing material include silicon (simple substance), and a silicon compound such as a material containing silicon, and either or both of nitrogen and oxygen, a material containing silicon and a transition metal, and a material containing silicon, and either or both of nitrogen and oxygen with a transition metal. Examples of the transition metal include molybdenum, tantalum and zirconium.

For the third layer as the process-aid film, the process-aid film is preferably composed of a silicon compound. The silicon compound has a silicon content of preferably at least 20 at %, more preferably at least 33 at %, and preferably up to 95 at %, and more preferably up to 80 at %. The nitrogen content is preferably up to 50 at %, more preferably up to 30 at %, and preferably at least 1 at %. The oxygen content is preferably up to 70 at %, more preferably up to 66 at %, and if the etching rate is necessarily adjusted, preferably at least 1 at %, more preferably at least 20 at %. A transition metal may be contained or not in the third layer. When the transition metal is contained the transition metal content is preferably up to 35 at %, more preferably up to 20 at %. In this case, a total content of silicon, oxygen, nitrogen and transition metal is preferably at least 95 at %, more preferably at least 99 at %, most preferably 100 at %.

For the second layer as the light shielding film, or the combination of a light shielding film and an antireflection film, and for the third layer as the process-aid film, the second layer has a thickness of usually 20 to 100 nm, and preferably 40 to 70 nm, and the third layer typically has a thickness of usually 1 to 30 nm, and preferably 2 to 15 nm. A total optical density of the phase shift film and the second layer are preferably at least 2.0, more preferably at least 2.5, most preferably at least 3.0, with respect to exposure light.

For the second layer as the process-aid film, a light shielding film may be provided as the third layer. The light shielding film in combination with the antireflection film may be provided as the third layer. In this case, the second layer may be used as a process-aid film (etching mask film) that functions as a hard mask in the process of patterning the phase shift film, and as a process-aid film (etching stopper film) in the process of patterning the third layer. The process-aid film is exemplified by a film composed of a chromium-containing material, such as disclosed in JP-A 2007-241065 (Patent Document 4). The process-aid film may consist of a single layer or multiple layers. Examples of the chromium-containing material of the process-aid film include chromium (simple substance), and a chromium compound such as chromium oxide (CrO), chromium nitride (CrN), chromium carbide (CrC), chromium oxynitride (CrON), chromium oxycarbide (CrOC), chromium nitride carbide (CrNC) and chromium oxynitride carbide (CrONC).

For the second layer as the process-aid film, the chromium compound in the second layer has a chromium content of preferably at least 40 at %, more preferably at least 50 at %, and preferably up to 100 at %, more preferably up to 99 at %, most preferably up to 90 at %. The oxygen content is preferably up to 60 at %, more preferably up to 55 at %, and if the etching rate is necessarily adjusted, preferably at least 1 at %. The nitrogen content is preferably up to 50 at %, more preferably up to 40 at %, and preferably at least 1 at %. The carbon content is preferably up to 20 at %, more preferably up to 10 at %, and if the etching rate is necessarily adjusted, preferably at least 1 at %. In this case, a total content of chromium, oxygen, nitrogen and carbon is preferably at least 95 at %, particularly at least 99 at %, most preferably 100 at %.

The light shielding film and the antireflection film as the third layer are preferably composed of a material that differs in etching characteristics from the second layer, such as a material resistant to chlorine-based dry etching for a chromium-containing material, in particular, a silicon-containing material which can be etched by fluorine-containing gases such as $SF_6$ and $CF_4$. Examples of the silicon-containing material include silicon (simple substance), and a silicon compound such as a material containing silicon, and either or both of nitrogen and oxygen, a material containing silicon and a transition metal, and a material containing silicon, and either or both of nitrogen and oxygen with a transition metal. Examples of the transition metal include molybdenum, tantalum and zirconium.

For the third layer as the light shielding film, or the combination of a light shielding film and an antireflection film, the light shielding film and the antireflection film are preferably composed of a silicon compound. The silicon compound has a silicon content of preferably at least 10 at %, more preferably at least 30 at %, and preferably less than 100 at %, more preferably up to 95 at %. The nitrogen content is preferably up to 50 at %, preferably up to 40 at %, and most preferably up to 20 at %, and if the etching rate is necessarily adjusted, preferably at least 1 at %. The oxygen content is preferably up to 60 at %, more preferably up to 30 at %, and if the etching rate is necessarily adjusted, preferably at least 1 at %. The transition metal content is preferably up to 35 at %, preferably up to 20 at %, and preferably at least 1 at %. In this case, a total content of silicon, oxygen, nitrogen and transition metal is preferably at least 95 at %, more preferably at least 99 at %, most preferably 100 at %.

For the second layer as the process-aid film, and for the third layer as the light shielding film, or the combination of a light shielding film and an antireflection film, the second layer has a thickness of usually 1 to 20 nm, and preferably 2 to 10 nm, and the third layer has a thickness of usually 20 to 100 nm, and preferably 30 to 70 nm. A total optical density of the phase shift film, the second layer and the third layer are preferably at least 2.0, more preferably at least 2.5, most preferably at least 3.0, with respect to exposure light.

Over the third layer of the phase shift mask blank of the invention, a fourth layer consisting of a single layer or multiple layers may be provided. The fourth layer is usually provided adjacent to the third layer. The fourth layer is specifically exemplified by a process-aid film that functions as a hard mask in the process of patterning the third layer. A material of the fourth layer is preferably a chromium-containing material.

Figure 2C:
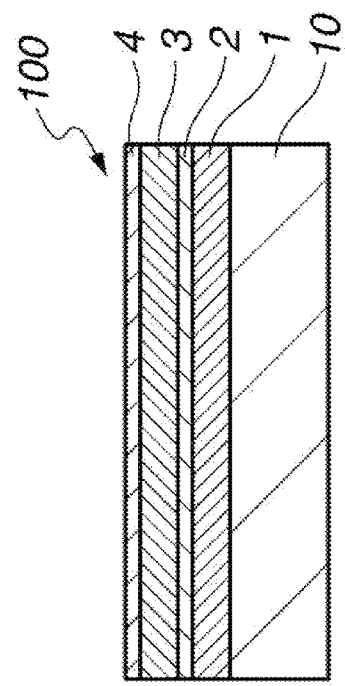

This embodiment is specifically exemplified by a phase shift mask blank illustrated in FIG. 2C. FIG. 2C is a cross-sectional view illustrating an exemplary phase shift mask blank of the invention. In this embodiment, the phase shift mask blank 100 includes a transparent substrate 10, a phase shift film 1 formed on the transparent substrate 10, a second layer 2 formed on the phase shift film 1, a third layer 3 formed on the second layer 2, and a fourth layer 4 formed on the third layer 3.

For the third layer as the light shielding film, or the combination of a light shielding film and an antireflection film, a process-aid film (etching mask film) which functions as a hard mask in the process of patterning the third layer may be provided as the fourth layer. The process-aid film is preferably composed of a material that differs in etching characteristics from the third layer, such as a material resistant to fluorine-based dry etching for a silicon-containing material, in particular, a chromium-containing material which can be etched by chlorine-based gases containing oxygen. The chromium-containing material is exemplified by chromium (simple substance), and a chromium compound such as chromium oxide (CrO), chromium nitride (CrN), chromium carbide (CrC), chromium oxynitride (CrON), chromium oxycarbide (CrOC), chromium nitride carbide (CrNC) and chromium oxynitride carbide (CrONC).

For the fourth layer as the process-aid film, the fourth layer has a chromium content of preferably at least 40 at %, more preferably at least 50 at %, and preferably up to 100 at %, more preferably up to 99 at %, most preferably up to 90 at %. The oxygen content is preferably up to 60 at %, more preferably up to 40 at %, and if the etching rate is necessarily adjusted, preferably at least 1 at %. The nitrogen content is preferably up to 50 at %, more preferably up to 40 at %, and if the etching rate is necessarily adjusted, preferably at least 1 at %. The carbon content is preferably up to 20 at %, more preferably up to 10 at %, and if the etching rate is necessarily adjusted, preferably at least 1 at %. In this case, a total content of chromium, oxygen, nitrogen and carbon is preferably at least 95 at %, more preferably at least 99 at %, most preferably 100 at %.

For the second layer as the process-aid film, for the third layer as the light shielding film, or the combination of a light shielding film and an antireflection film, and for the fourth layer as the process-aid film, the second layer has a thickness of usually 1 to 20 nm, and preferably 2 to 10 nm, the third layer has a thickness of usually 20 to 100 nm, and preferably 30 to 70 nm, and the fourth layer has a thickness of usually 1 to 30 nm, and preferably 2 to 20 nm. A total optical density of the phase shift film, the second layer and the third layer are preferably at least 2.0, more preferably at least 2.5, most preferably at least 3.0, with respect to exposure light.

The film composed of the chromium-containing material for the second layer and the fourth layer may be formed by reactive sputtering using a target such as chromium target, or a target containing chromium that is added one or more elements selected from the group consisting of oxygen, nitrogen and carbon, and using a sputtering gas containing a rare gas such as Ar, He and Ne that is properly added with a reactive gas selected from the group consisting of an oxygen-containing gas, a nitrogen-containing gas and a carbon-containing gas, according to a composition of the film to be formed.

Meanwhile, the film composed of the silicon-containing material for the third layer may be formed by reactive sputtering using a target such as a silicon target, a silicon nitride target, a target containing both of silicon and silicon nitride, a transition metal target, and a composite target of silicon and transition metal, and using a sputtering gas containing a rare gas such as Ar, He and Ne that is properly added with a reactive gas selected from the group consisting of an oxygen-containing gas, a nitrogen-containing gas and a carbon-containing gas, according to a composition of the film to be formed.

The phase shift mask of the invention may be manufactured by any of usual methods from the phase shift mask blank. From an exemplary phase shift mask blank including a film composed of a chromium-containing material formed as a second layer on a phase shift film, the phase shift mask may be manufactured typically by the following processes.

First, an electron beam resist film is formed on the second layer of the phase shift mask blank, a pattern is drawn by electron beam, followed by a predetermined operation of development, to obtain a resist pattern. Next, the obtained resist pattern is used as an etching mask, and the resist pattern is transferred to the second layer by chlorine-based dry etching containing oxygen, to obtain a second layer pattern. Next, the obtained second layer pattern is used as an etching mask, and the second layer pattern is transferred to the phase shift film by fluorine-based dry etching, to obtain a phase shift film pattern. In case where a part of the second layer is needed to be remained, another resist pattern that protects such part to be remained is formed on the second layer, and a part of the second layer not protected with the resist pattern is removed by chlorine-based dry etching containing oxygen. The resist pattern is then removed by a usual method to obtain the phase shift mask.

From an exemplary phase shift mask blank including a light shielding film or a combination of a light shielding film and an antireflection film, composed of a chromium-containing material, as a second layer on a phase shift film, and a process-aid film composed of a silicon-containing material as a third layer on the second layer, the phase shift mask may be manufactured typically by the following processes.

First, an electron beam resist film is formed on the third layer of the phase shift mask blank, a pattern is drawn by electron beam, followed by a predetermined operation of development, to obtain a resist pattern. Next, the obtained resist pattern is used as an etching mask, and the resist pattern is transferred to the third layer by fluorine-based dry etching, to obtain a third layer pattern. Next, the obtained third layer pattern is used as an etching mask, and the third layer pattern is transferred to the second layer by chlorine-based dry etching containing oxygen, to obtain a second layer pattern. The resist pattern is then removed, and the obtained second layer pattern is used as an etching mask, and the second layer pattern is transferred to the phase shift film by fluorine-based dry etching, to obtain a phase shift film pattern and to concurrently remove the third layer pattern. Next, another resist pattern that protects a part of the second layer to be remained is formed on the second layer, and a part of the second layer not protected with the resist pattern is removed by chlorine-based dry etching containing oxygen. The resist pattern is then removed by a usual method to obtain the phase shift mask.

Meanwhile, from an exemplary phase shift mask blank including a process-aid film composed of a chromium-containing material as a second layer on a phase shift film, and a light shielding film or a combination of a light shielding film and an antireflection film, composed of a silicon-containing material, as a third layer on the second layer, the phase shift mask may be manufactured typically by the following processes.

First, an electron beam resist film is formed on the third layer of the phase shift mask blank, a pattern is drawn by electron beam, followed by a predetermined operation of development, to obtain a resist pattern. Next, the obtained resist pattern is used as an etching mask, and the resist pattern is transferred to the third layer by fluorine-based dry etching, to obtain a third layer pattern. Next, the obtained third layer pattern is used as an etching mask, and the third layer pattern is transferred to the second layer by chlorine-based dry etching containing oxygen, to obtain a second layer pattern that a part where the phase shift film will be removed has been removed. The resist pattern is then removed. Next, another resist pattern that protects a part of the third layer to be remained is formed on the third layer, and the obtained second layer pattern is used as an etching mask, and the second layer pattern is transferred to the phase shift film by fluorine-based dry etching, to obtain a phase shift film pattern, and to concurrently remove a part of the third layer which is not protected with the resist pattern. The resist pattern is then removed by a usual method. Further, the part of the second layer, which is exposed in the part where the third layer has been removed, is then removed by chlorine-based dry etching containing oxygen, to obtain the phase shift mask.

Further, from an exemplary phase shift mask blank including a process-aid film composed of a chromium-containing material as a second layer on a phase shift film, a light shielding film or a combination of a light shielding film and an antireflection film, composed of a silicon-containing material, as a third layer on the second layer, and a process-aid film composed of a chromium-containing material, as a fourth layer on the third layer, the phase shift mask may be manufactured typically by the following processes.

First, an electron beam resist film is formed on the fourth layer of the phase shift mask blank, a pattern is drawn by electron beam, followed by a predetermined operation of development, to obtain a resist pattern. Next, the obtained resist pattern is used as an etching mask, and the resist pattern is transferred to the fourth layer by chlorine-based dry etching containing oxygen, to obtain a fourth layer pattern. Next, the obtained fourth layer pattern is used as an etching mask, and the fourth layer pattern is transferred to the third layer by fluorine-based dry etching, to obtain a third layer pattern. The resist pattern is then removed. Next, another resist pattern that protects a part of the third layer to be remained is formed on the fourth layer, and the obtained third layer pattern is used as an etching mask, and the third layer pattern is transferred to the second layer by chlorine-based dry etching containing oxygen, to obtain a second layer pattern, and to concurrently remove a part of the fourth layer which is not protected with the resist pattern. Next, the second layer pattern is used as an etching mask, and the second layer pattern is transferred to the phase shift film by fluorine-based dry etching, to obtain a phase shift film pattern, and to concurrently remove a part of the third layer which is not protected with the resist pattern. The resist pattern is then removed by a usual method. Further, the part of the second layer, which is exposed in the part where the third layer has been removed, and the part of the fourth layer exposed in the part where the resist pattern has been removed, are then removed by chlorine-based dry etching containing oxygen, to obtain the phase shift mask.

EXAMPLES

Examples of the invention are given below by way of illustration and not by way of limitation.

Example 1

A 152 mm square, 6.35 mm thick 6025 quartz substrate was placed in a chamber of a sputtering apparatus, and eight kinds of single-layer phase shift films composed of SiN that have different compositions each other was formed thereon by using a silicon target as a sputtering target, and argon gas and nitrogen gas as a sputtering gas, under the conditions of a discharge power of 1.9 kW, a flow rate of argon gas of 28 sccm (fixed), and a flow rate of nitrogen gas set between 19 sccm and 40 sccm.

Refractive indexes n and extinction coefficients k, as an optical constant with respect to KrF excimer layer (wavelength of 248 nm), of the films were obtained. Graphs plotting refractive indexes n and extinction coefficients k with respect to flow rates of nitrogen gas are shown in FIGS. 3 and 4, respectively. The compositions of the films were measured by XPS (X-ray photoelectron spectroscopy, the same shall apply hereinafter). A graph plotting refractive indexes n with respect to content ratios N/(Si+N) (atomic ratio) is shown in FIG. 5. From FIG. 5, it was found that the flow rate indicating the highest refractive index n corresponds to the content ratio N/(Si+N) of approx. 0.47.

Next, a 152 mm square, 6.35 mm thick 6025 quartz substrate was placed in a chamber of a sputtering apparatus, and a single-layer phase shift film composed of SiN was formed thereon by using a silicon target as a sputtering target, and argon gas and nitrogen gas as a sputtering gas, under the conditions of a discharge power of 1.9 kW, a flow rate of argon gas of 28 sccm, and a flow rate of nitrogen of 27 sccm.

With respect to KrF excimer layer (wavelength of 248 nm), the phase shift film had a refractive index n of 2.60 and an extinction coefficient k of 0.70, and had a phase shift of 177°, a transmittance of 4.5%, and a thickness of 79 nm. A content ratio N/(Si+N) (atomic ratio), measured by XPS, was 0.49.

Example 2

A 152 mm square, 6.35 mm thick 6025 quartz substrate was placed in a chamber of a sputtering apparatus, and eight kinds of single-layer phase shift films composed of SiN that have different compositions each other was formed thereon by using a silicon target as a sputtering target, and argon gas and nitrogen gas as a sputtering gas, under the conditions of a discharge power of 1.9 kW, a flow rate of argon gas of 17 sccm (fixed), and a flow rate of nitrogen gas set between 10 sccm and 30 sccm.

Refractive indexes n and extinction coefficients k, as an optical constant with respect to KrF excimer layer (wavelength of 248 nm), of the films were obtained. The compositions of the films were measured by XPS. It was found that the flow rate indicating the highest refractive index n, which was confirmed according to the same way of Example 1, corresponds to the content ratio N/(Si+N) of approx. 0.47.

Next, a 152 mm square, 6.35 mm thick 6025 quartz substrate was placed in a chamber of a sputtering apparatus, and a single-layer phase shift films composed of SiN was formed thereon by using a silicon target as a sputtering target, and argon gas and nitrogen gas as a sputtering gas, under the conditions of a discharge power of 1.9 kW, a flow rate of argon gas of 17 sccm, and a flow rate of nitrogen of 27 sccm.

With respect to KrF excimer layer (wavelength of 248 nm), the phase shift film had a refractive index n of 2.60 and an extinction coefficient k of 0.60, and had a phase shift of 179°, a transmittance of 6.7%, and a thickness of 80 nm. A content ratio N/(Si+N) (atomic ratio), measured by XPS, was 0.50.

Example 3

A 152 mm square, 6.35 mm thick 6025 quartz substrate was placed in a chamber of a sputtering apparatus, and a single-layer phase shift films composed of SiON was formed thereon by using a silicon target as a sputtering target, and argon gas, nitrogen gas and oxygen gas as a sputtering gas, under the conditions of a discharge power of 1.9 kW, a flow rate of argon gas of 28 sccm, a flow rate of nitrogen of 26 sccm, and a flow rate of oxygen of 1.5 sccm.

With respect to KrF excimer layer (wavelength of 248 nm), the phase shift film had a refractive index n of 2.52 and an extinction coefficient k of 0.56, and had a phase shift of 178°, a transmittance of 7.3%, and a thickness of 83 nm. A content ratio N/(Si+N) (atomic ratio), measured by XPS, was 0.49, and an oxygen content was 2 at %.

Comparative Example 1

A 152 mm square, 6.35 mm thick 6025 quartz substrate was placed in a chamber of a sputtering apparatus, and a two-layer phase shift film consisting of a lower layer and an upper layer was formed by using a silicon target as a sputtering target, and argon gas and nitrogen gas as a sputtering gas, under the conditions of a discharge power of 1.9 kW, a flow rate of argon gas of 28 sccm, and a flow rate of nitrogen of 19 sccm, for the lower layer (thickness: 27 nm) composed of SiN; and by using the same target and gases under the same conditions other than a changed flow rate of nitrogen gas of 35 sccm, for the upper layer (thickness: 64 nm) composed of SiN.

With respect to KrF excimer layer (wavelength of 248 nm), the phase shift film had refractive indexes n of 2.45 in the lower layer and 2.38 in the upper layer, and extinction coefficients k of 1.5 in the lower layer and 0.07 in the upper layer, and had a phase shift of 177°, and a transmittance of 6.2%, however, the thickness of the film was 91 nm and the film was formed thick. Content ratios N/(Si+N) (atomic ratio), measured by XPS, was 0.40 in the lower layer and 0.53 in the upper layer.

Comparative Example 2

A 152 mm square, 6.35 mm thick 6025 quartz substrate was placed in a chamber of a sputtering apparatus, and a single-layer phase shift film composed of SiN that is a compositionally graded layer having a composition continuously varying in a thickness direction, and having optical characteristics varying in the thickness direction was formed thereon by using a silicon target as a sputtering target, and argon gas and nitrogen gas as a sputtering gas, under the conditions of a discharge power of 1.9 kW, a flow rate of argon gas of 28 sccm, and a flow rate of nitrogen gas continuously varied from 19 to 45 sccm.

With respect to KrF excimer layer (wavelength of 248 nm), the phase shift film had refractive indexes n of 2.45 at the lower surface adjacent to the substrate side and 2.33 at the upper surface remote from the substrate side, and extinction coefficients k of 1.5 at the lower surface adjacent to the substrate side and 0.05 at the upper surface remote from the substrate side, and had a phase shift of 177°, and a transmittance of 6.0%, however, the thickness of the film was 87 nm and the film was formed thick. Content ratios N/(Si+N) (atomic ratio), measured by XPS, was 0.40 at the lower surface adjacent to the substrate side and 0.53 at the upper surface remote from the substrate side.

Comparative Example 3

A 152 mm square, 6.35 mm thick 6025 quartz substrate was placed in a chamber of a sputtering apparatus, and a single-layer phase shift films composed of MoSiON was formed thereon by using a molybdenum silicon (MoSi) target and a silicon target as a sputtering target, and argon gas, nitrogen gas and oxygen gas as a sputtering gas, under the conditions of a discharge power of MoSi target of 1.2 kW, a discharge power silicon target of 8 kW, a flow rate of argon gas of 5 sccm, a flow rate of nitrogen of 65 sccm, and a flow rate of oxygen of 2.5 sccm.

With respect to KrF excimer layer (wavelength of 248 nm), the phase shift film had a refractive index n of 2.25 and an extinction coefficient k of 0.52, and had a phase shift of 175°, a transmittance of 6.2%, however, the thickness of the film was 99 nm and the film was formed thick. A molybdenum content was 14 at %, and a content ratio N/(Si+N) (atomic ratio) was 0.56, measured by XPS.

Japanese Patent Application Nos. 2019-067113 and 2019-111054 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A phase shift mask blank comprising a substrate, and a phase shift film thereon, the phase shift film composed of a material containing silicon and nitrogen and free of a transition metal, wherein
   exposure light is KrF excimer laser,
   the phase shift film consists of a plurality of layers,
   the plurality of layers consists of an oxidized surface layer formed as the outermost layer on the side remote from the substrate, and one or more layers having a refractive index n of at least 2.5 and an extinction coefficient k of 0.4 to 1, with respect to the exposure light, respectively, and
   the phase shift film has a phase shift of 170 to 190° and a transmittance of 4 to 8%, with respect to the exposure light, and a thickness of up to 85 nm.

2. The phase shift mask blank of claim 1, wherein the oxidized surface layer has an oxygen content of at least 20 at %.

3. The phase shift mask blank of claim 1, wherein the phase shift film has a thickness of at least 50 nm.

4. The phase shift mask blank of claim 3, wherein the oxidized surface layer has a thickness of 1 to 10 nm.

5. The phase shift mask blank of claim 1, wherein said one or more layers has a content ratio N/(Si+N) within a range of 0.43 to 0.53, the ratio N/(Si+N) representing nitrogen content (at %) to the sum of silicon and nitrogen contents (at %).

6. The phase shift mask blank of claim 1, wherein each of said one or more layers consists essentially of silicon and nitrogen.

7. A method of manufacturing the phase shift mask blank of claim 1, comprising the step of:
   forming the phase shift film by reactive sputtering using a silicon-containing target and nitrogen gas, wherein
   in the forming step, a flow rate of the nitrogen gas is set to a value of −20% to +20% of the flow rate imparting the highest refractive index n, with respect to the exposure light, of the phase shift film, and maintained constant or varied continuously or stepwise, the flow rate imparting the highest refractive index n being obtained from varying the flow rate from low rate to high rate.

8. The method of claim 7, wherein in the forming step, the flow rate of the nitrogen gas is set to the flow rate imparting the highest refractive index n, with respect to the exposure light, of the phase shift film, and maintained constant.

9. The method of claim 7, wherein the sputtering is a magnetron sputtering, and the silicon-containing target is a silicon target.

10. A phase shift mask manufactured by using the phase shift mask blank of claim 1.

11. A phase shift mask blank comprising a substrate, and a phase shift film thereon, the phase shift film composed of a material containing silicon and nitrogen and free of a transition metal, wherein
    exposure light is KrF excimer laser,
    the phase shift film consists of a plurality of layers,
    the plurality of layers consists of an oxidized surface layer formed as the outermost layer on the side remote from the substrate, and one or more layers having a content ratio N/(Si+N) within a range of 0.43 to 0.53, the ratio N/(Si+N) representing nitrogen content (at %) to the sum of silicon and nitrogen contents (at %), and
    the phase shift film has a phase shift of 170 to 190° with respect to the exposure light.

12. The phase shift mask blank of claim 11, wherein the oxidized surface layer has an oxygen content of at least 20 at %.

13. The phase shift mask blank of claim 11, wherein the phase shift film has a thickness of at least 50 nm.

14. The phase shift mask blank of claim 13, wherein the oxidized surface layer has a thickness of 1 to 10 nm.

15. The phase shift mask blank of claim 11, wherein the phase shift film has a thickness of up to 85 nm.

16. The phase shift mask blank of claim 11, wherein each of said one or more layers consists essentially of silicon and nitrogen.

17. A method of manufacturing the phase shift mask blank of claim 11, comprising the step of:
    forming the phase shift film by reactive sputtering using a silicon-containing target and nitrogen gas, wherein
    in the forming step, a flow rate of the nitrogen gas is set to a value of −20% to +20% of the flow rate imparting the highest refractive index n, with respect to the exposure light, of the phase shift film, and maintained constant or varied continuously or stepwise, the flow rate imparting the highest refractive index n being obtained from varying the flow rate from low rate to high rate.

18. The method of claim 17, wherein in the forming step, the flow rate of the nitrogen gas is set to the flow rate imparting the highest refractive index n, with respect to the exposure light, of the phase shift film, and maintained constant.

19. The method of claim 17, wherein the sputtering is a magnetron sputtering, and the silicon-containing target is a silicon target.

20. A phase shift mask manufactured by using the phase shift mask blank of claim 11.

* * * * *